United States Patent [19]
Taniguchi et al.

[11] Patent Number: 5,434,436
[45] Date of Patent: Jul. 18, 1995

[54] MASTER-SLICE TYPE SEMICONDUCTOR INTEGRATED CIRCUIT DEVICE HAVING MULTI-POWER SUPPLY VOLTAGE

[75] Inventors: Hideki Taniguchi; Masahiro Suzuki, both of Itami, Japan

[73] Assignee: Mitsubishi Denki Kabushiki Kaisha, Tokyo, Japan

[21] Appl. No.: 82,456

[22] Filed: Jun. 25, 1993

[30] Foreign Application Priority Data

Oct. 28, 1992 [JP] Japan ................................. 4-289968

[51] Int. Cl.⁶ ........................................... H01L 27/02
[52] U.S. Cl. ................................. 257/203; 257/206; 257/207
[58] Field of Search ............... 257/203, 206, 208, 210, 257/207

[56] References Cited

U.S. PATENT DOCUMENTS

| | | | |
|---|---|---|---|
| 4,992,845 | 2/1991 | Arakawa et al. | 257/206 |
| 5,007,025 | 4/1991 | Hwang et al. | 365/226 |
| 5,083,181 | 1/1992 | Yoshida et al. | 257/203 |
| 5,119,169 | 5/1992 | Kozono et al. | 357/68 |

FOREIGN PATENT DOCUMENTS

| | | |
|---|---|---|
| 0163384A1 | 1/1985 | European Pat. Off. . |
| 3223276A1 | 5/1983 | Germany . |
| 237749 | 2/1990 | Japan . |
| 360054 | 3/1991 | Japan . |

*Primary Examiner*—William Mintel
*Assistant Examiner*—Roy Potter
*Attorney, Agent, or Firm*—Oblon, Spivak, McClelland, Maier & Neustadt

[57] ABSTRACT

A plurality of different power source potentials are optionally selected in a semiconductor integrated circuit. First and second semiconductor segments (3) and (4) are both in the form of a number of rows which are separated from each other by spacings (14). Power source wires (6) and (7) for supplying potentials (V1) and (V2) are disposed above the second semiconductor regions (4). Cells are formed in different wells, and therefore, it is possible that different cells receive different power source potentials. Contacts (61) or (71) are made to the second semiconductor segments (4) so that the second semiconductor segments (4) are connected to the power source wire (6) or (7). Selection of and connection to one of the wires are attained in a slicing process.

3 Claims, 10 Drawing Sheets

MASTER-SLICE TYPE SEMICONDUCTOR INTEGRATED CIRCUIT DEVICE HAVING MULTI-POWER SUPPLY VOLTAGE

BACKGROUND OF THE INVENTION

1. Field of the Invention

The present invention relates to a semiconductor integrated circuit, and particularly to a master slice semiconductor integrated circuit which uses a plurality of power source voltages.

2. Description of the Prior Art

FIG. 7 is a plan view showing the chip structure of a conventional master slice semiconductor integrated circuit. FIG. 8 is a plan view enlarging a region X of FIG. 7 to show the structure of a cell and a region around the same. To dispose cells which form input-/output circuits which attain input to and output from an inner region 5, a first semiconductor region 3 of a first conductivity type and a second semiconductor region 4 of a second conductivity type are formed on a peripheral portion of the inner region 5. Input/output pads 1 are connected to the input/output circuits through metal wires 2. Power source wires 7 and 8 are disposed above the first and the second semiconductor regions 3 and 4, respectively. For simplicity of illustration, FIG. 8 does not show in detail how the metal wires 2 are connected to the first and the second semiconductor regions 3 and 4.

FIG. 9 is a cross sectional view of one of the cells and FIG. 10 is a perspective cross sectional view showing a portion of the array of the cells. The first and the second semiconductor regions 3 and 4 are formed in the same substrate 15 as a well. In the first and the second semiconductor regions 3 and 4, a MOS transistor of the second conductivity type and a MOS transistor of the first conductivity type are respectively formed. The MOS transistors of the two different types form an invertor circuit in the cell so that the cell functions as an input/output circuit.

The MOS transistor formed in the first semiconductor region 3 comprises a gate electrode 10, source and drain diffusion regions 12a of the second conductivity type, and a diffusion region 12b of the first conductivity type to which a back gate voltage is applied. Similarly, the MOS transistor formed in the second semiconductor region 4 comprises a gate electrode 9, source and drain diffusion regions 11a of the first conductivity type, and a diffusion region 11b of the second conductivity type for receiving a back gate voltage. FIGS. 7 and 8 omit these for simplicity of illustration.

Fabrication of a master slice semiconductor integrated circuit, that is, a large scale integrated circuit, involves master process for forming a transistor, and slicing process which includes formation of contacts, wiring layers and via holes. In other words, after obtaining a master structure, the cells as that shown in FIG. 8 are arranged on the master structure in accordance with predetermined data during the slicing process so that the LSI as that shown in FIG. 7 is eventually manufactured.

Having such a construction, the conventional master slice LSI receives a potential V1 to the second semiconductor region 4 through the diffusion region 11b (which receives the back gate voltage) of the second conductivity type and receives a potential GND (i.e., a ground potential) to the first semiconductor region 3 through the diffusion region 12b (which receives the back gate voltage) of the first conductivity type.

On the other hand, the cells which are distinctive from each other are formed in the same well. Hence, when different power source potentials are given to different cells, the potentials would short circuit since only one potential is allowed to each one of the first and the second semiconductor regions 3 and 4.

SUMMARY OF THE INVENTION

A semiconductor integrated circuit of an aspect of the present invention comprises: a plurality of first semiconductor regions which are insulated from each other and arranged in a first lateral direction; and a plurality of first power source wires which are disposed above all of the plurality of the first semiconductor regions in space from the plurality of the first semiconductor regions. One of the plurality of the first power source wires is connected to each one of the plurality of the first semiconductor regions.

The plurality of the first semiconductor regions may all have a first conductivity type.

The first power source wires may be disposed in the first lateral direction.

The semiconductor integrated circuit may further comprises a plurality of second semiconductor regions which are arranged in the first lateral direction, the plurality of the second semiconductor regions being each disposed adjacent to each one of the first semiconductor regions in a second lateral direction which is perpendicular to the first lateral direction.

The plurality of the second semiconductor regions may have a second conductivity type which is different from the first conductivity type.

The semiconductor integrated circuit of claim 5 may further comprises a second power source wire which is disposed above all of the plurality of the second semiconductor regions.

The second power source wire is preferably connected to all of the plurality of the second semiconductor regions.

The plurality of the first semiconductor regions may be arranged to form a ring-like configuration.

The semiconductor integrated circuit of claim 8 preferably further comprises an inner circuit which is surrounded by the plurality of the first semiconductor regions.

Preferably, at least one first semiconductor device is formed in the first semiconductor regions.

The first semiconductor device may be a MOS transistor which comprises a first current electrode, a control electrode and a second current electrode, the first current electrode being formed by the second semiconductor regions to which the first power source wires are connected.

The first power source wires may be disposed parallel to each other in the second lateral direction.

The current electrode is preferably wider than the second current electrode.

Alternatively, the first power source wires may be disposed one atop the other.

Preferably, each one of the first power source wires has notches, when viewed from above, the notches of one of the first power source wires does not overlap the notches of the other one of the first power source wires.

A plurality of the semiconductor devices may be formed in the first semiconductor regions.

A second semiconductor device may be formed in the second semiconductor regions and the first and the second semiconductor devices may form an input/output circuit which attains input to and output from the inner circuit.

Thus, the plurality of the power source wires provide different power source potentials to the respective semiconductor regions. The respective semiconductor regions are insulated from each other, and therefore, it is possible to prevent the different power source potentials from interfering with each other.

A plurality of power source potentials can be used in the same semiconductor integrated circuit. It is also possible to select any one of the power source potentials during slice process.

Equally important, supply of a plurality of power source potentials is attained without changing an area occupied by the power source wires.

Accordingly, it is an object of the present invention to obtain by the slice process a semiconductor integrated circuit in which a plurality of different power source potentials are selected as desired.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
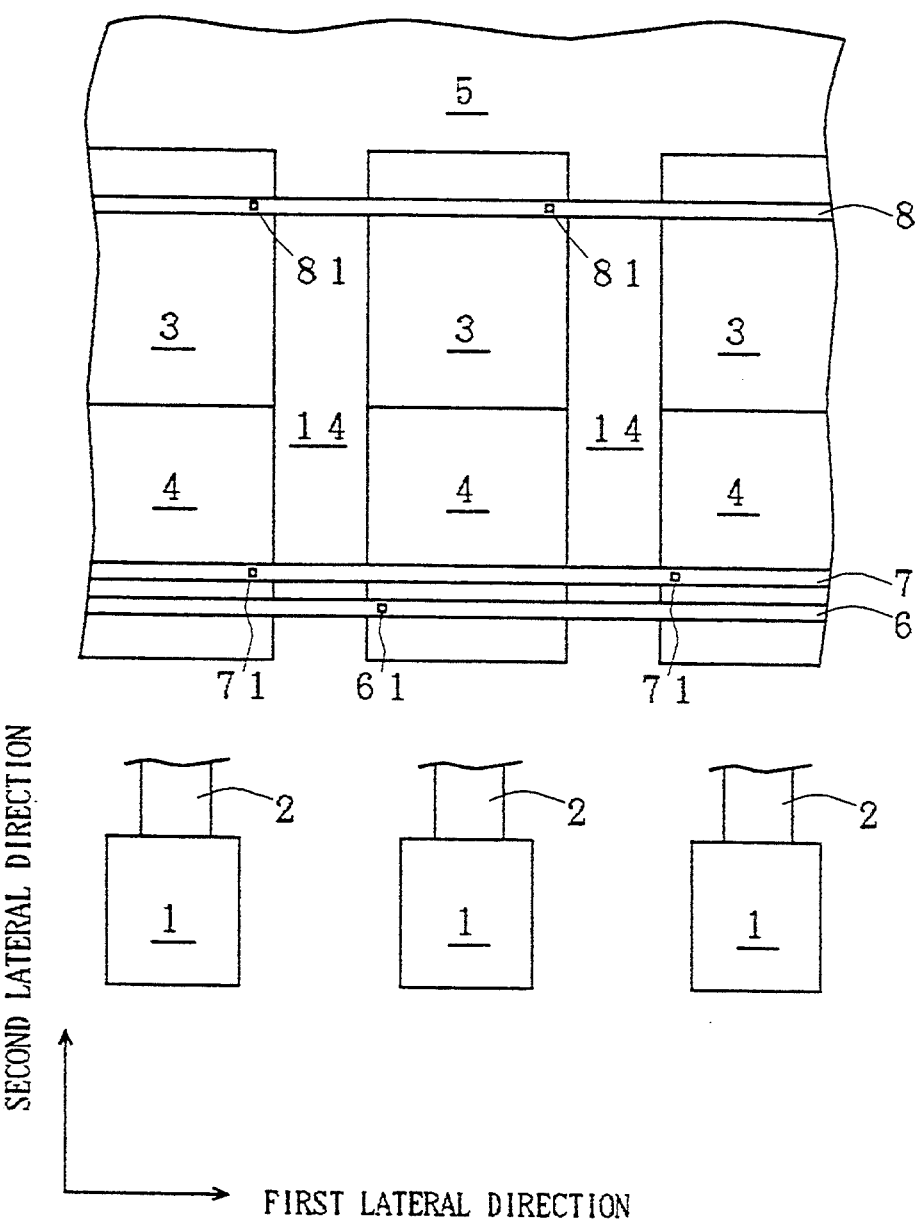
FIG. 1 and 2 are plan views showing a first preferred embodiment.
Figure 2:
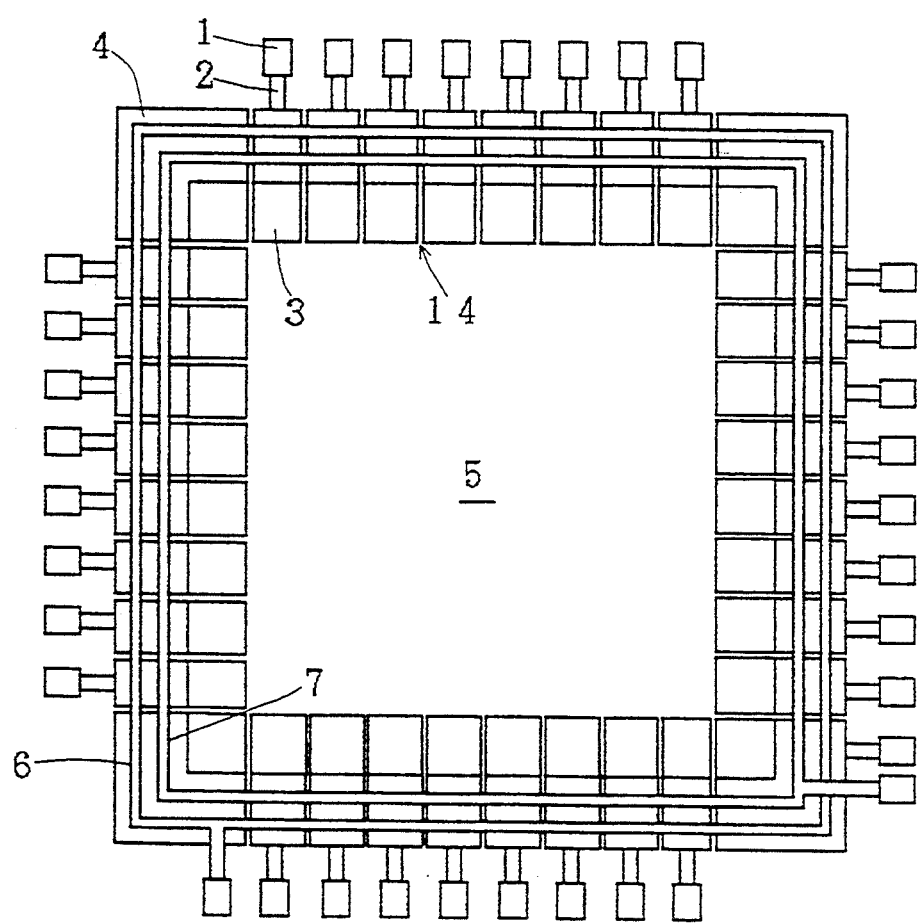

FIG. 1 is a plan view showing the chip structure of a master slice semiconductor integrated circuit according to a first preferred embodiment of the present invention. FIG. 2 is a plan view showing the whole chip structure of the first preferred embodiment.

To dispose cells which form input/output circuits which attain input to and output from an inner region 5, first semiconductor regions 3 of a first conductivity type and second semiconductor regions 4 of a second conductivity type are formed on a peripheral portion of the inner region 5. For simplicity of illustration, FIGS. 1 and 2 omit a substrate 15 on which the first and the second semiconductor regions 3 and 4 are formed. Input/output pads 1 are connected to the input/output circuits through metal wires 2. Details of the connection for the metal wires 2 are not shown for simplicity of illustration.

The first and the second semiconductor regions 3 and 4 are both in the form of a number of rows which are separated from each other by spacings 14. Power source wires 6 and 7 for supplying potentials V1 and V2 are disposed above the second semiconductor regions 4. A power source wire 8 for supplying a ground potential is disposed on the first semiconductor regions 3. For simplicity of illustration, FIG. 2 omits the power source wire 8.

A cell is not realized across a plurality of the first and the second semiconductor regions 3 and 4 but is disposed in each one of the first and the second semiconductor regions 3 and 4. Thus, the cells are formed in different wells, and therefore, it is possible that different cells receive different power source potentials. In addition, which one of the potentials V1 and V2 is to be given to each second semiconductor region 4 is optionally determined by connecting one of the power source wires 7 and 6 to the second semiconductor region 4 via a contact.

More precisely, through contacts 71 and 61 which are formed during the slice process, the power source wires 7 and 6 supply the potentials V1 and V2 to the second semiconductor regions 4. To the first semiconductor regions 3, the ground potential is supplied from the power source wire 8 through a contact 81.

Figure 3:
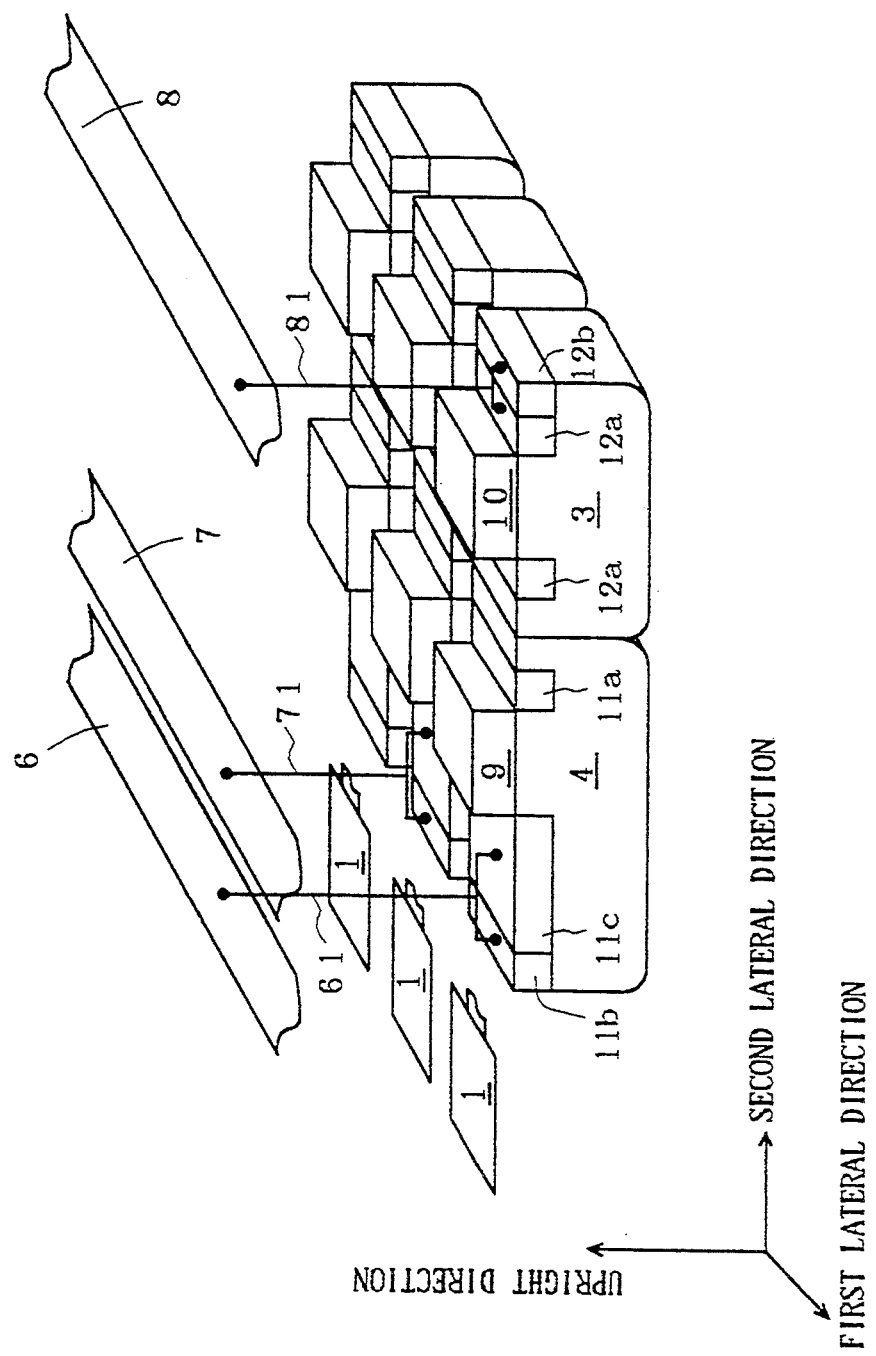
FIG. 3 is a perspective cross sectional view showing the first preferred embodiment.

FIG. 3 is a perspective cross sectional view showing in detail transistors which are formed in the first and the second semiconductor regions 3 and 4 and connection made to the transistors. For simplicity of illustration, FIG. 3 omits the substrate 15.

In each one of the first and the second semiconductor regions 3 and 4, a MOS transistor is formed. Formed in the first semiconductor region 3 is a MOS transistor of the second conductivity type comprising a MOS gate 10, a source (drain) 12a and a diffusion region 12b for receiving a back gate voltage. A MOS transistor formed in the second semiconductor region 4 has the first conductivity type and comprises a MOS gate 9, a source 11c, a drain 11a and a diffusion region 11b for receiving a back gate voltage.

The gates 9 and 10, for instance, of the MOS transistors are connected in common to the metal wire 2 so that the MOS transistors form an invertor and hence serve as an input/output circuit. Details of the connection for the metal wires 2 are not shown to avoid incumbrance of illustration.

Contacts 61 and 71 are made during the slicing process between the source 11 c or the diffusion region 11b and either one of the power source wires 7 and 6. To make the contacts, the source 11c is formed wider than the drain 11a so that both the power source wires 7 and 6 lie above the source 11c or the diffusion region 11b.

It is easy to ensure that such contacts 61 and 71 will not interfere with connection made to the metal wires 2, e.g., connection between the metal wires 2 and the gates 9 and 10. For example, the contacts 61 and 71 are disposed near the spacings 14 which separate adjacent second semiconductor regions 4 and each metal wire 2 is disposed to be connected to a center portion of each second semiconductor region 4 as shown in FIG. 1.

The term "first lateral direction" is herein used to refers to the direction in which the rows of the first and the second semiconductor regions 3 and 4 extend and the term "second lateral direction" is used to refer to the direction in which the first and the second semiconductor regions 3 are 4 are arranged next to each other (See FIGS. 1 and 3). Further, "upright direction" refers to a direction which is perpendicular to both the first and the second lateral directions (See FIG. 3) and shows a positional relation of the power source wires 6 and 7 relative to the second semiconductor regions 4.

To obtain the semiconductor integrated circuit according to the present invention, master process and slicing process as follows are necessary.

In the master process, a plurality of input/output buffer cell units separated from each other by the spacings 14 are disposed on the substrate 15 of the input/output circuit part beforehand. Next, as shown in FIG. 3, slice cells having the same layout, e.g., the same MOS transistors are disposed on the respective input/output buffer cell units. Following this, a plurality of main lines such as the power source wires 7 and 6 are disposed above the contact regions, e.g., the diffusion regions 11b for receiving a back gate voltage and the sources 11c, of the second semiconductor regions 4 of the input/output buffer cell units.

In the subsequent slicing process, which one of the contacts 71 and 61, which lead to the power source wires 7 and 6, is to be made to the second semiconductor regions 4 is optionally determined. Hence, wanted power source potentials are selected.

Thus, since the device is fabricated in the slicing process in such a manner that a desired power source potential is selected from the power source wires which provide different power source potentials and since the semiconductor regions are spaced away from each other, it is possible that one of the different power source potentials is selected without inviting short circuits of the different power source potentials on the same substrate.

Second Preferred Embodiment

Figure 4:
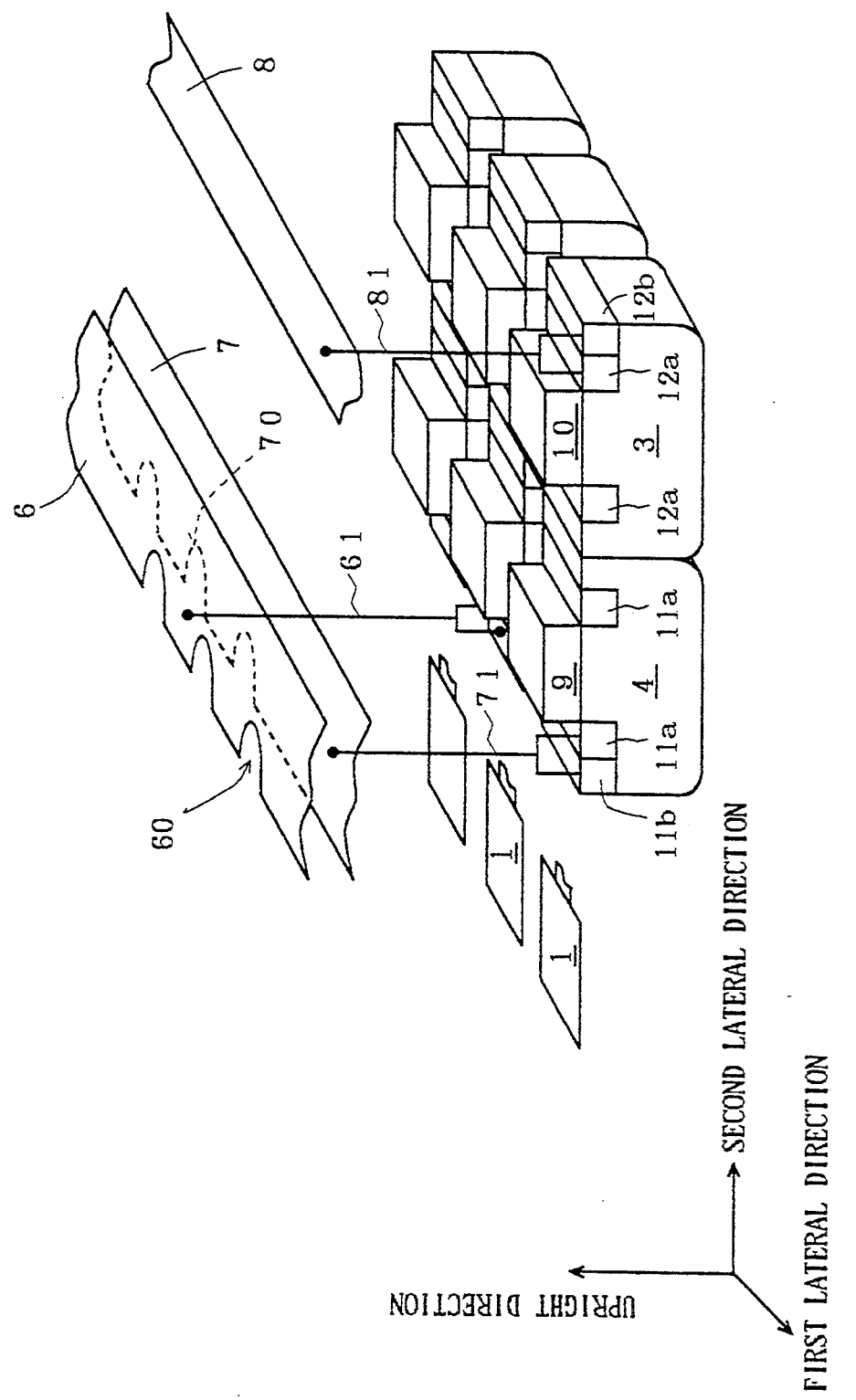
FIG. 4 is a perspective cross sectional view showing a second preferred embodiment.

FIG. 4 is a perspective cross sectional view showing in detail transistors which are formed in a plurality of the first and the second semiconductor regions 3 and 4 in a second preferred embodiment. Connection made to the transistors is also shown in FIG. 4. In the second preferred embodiment, the power source wires 7 and 6 are in a multi-layer structure and insulated from each other above the second semiconductor regions.

In the slicing process, the power source wire 6 is formed to include notches 60 through which the contacts 71 to the power source wire 7 are made. To prevent the contacts 61 to the power source wire 6 from short circuiting with the power source wire 7, the power source wire 7 includes notches 70.

Figure 5:
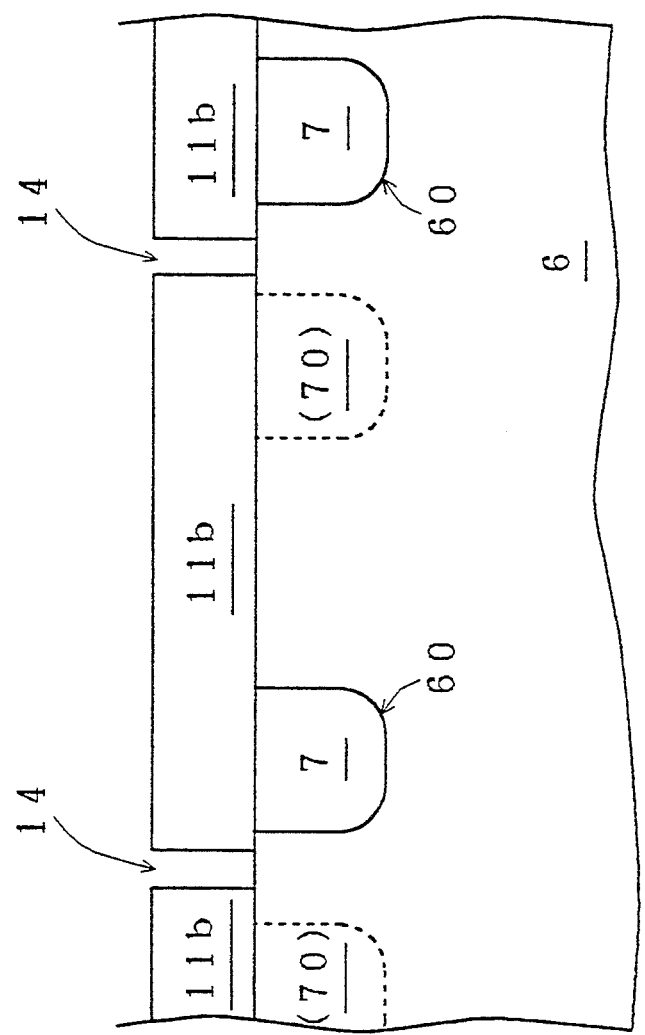
FIG. 5 is a plan view showing the second preferred embodiment.

FIG. 5 is a plan view enlarging the notches 60 and 70 and a region around the same. In FIG. 5, the most portion of the power source wire 7 and the notches 70 of the power source wire 7 are behind the power source wire 6, and therefore, only portions of the power source wire 7 are seen through the notches 60. During the slicing process, in forming the contact regions, e.g., in making the contacts 71 between the diffusion regions 11b which receive the back gate voltage and the power source wire 7, the structure is processed through the notches 60. In making the contacts 61 to the power source wire 6, the structure is processed through the notches 70.

Formed in a multi-layer structure, a plurality of power source wires, i.e, the power source wires 6 and 7 are disposed without enlarging the area occupied by the contact regions. In this case, too, by disposing the notches 60 and 70 near the spacings 14 which separate adjacent second semiconductor regions 4 and by connecting each metal wire 2 to a center portion of each second semiconductor region 4, it is possible that the contact regions do not interfere with connection made to the metal wires 2, e.g., connection between the metal wires 2 and the gates 9 and 10.

Third Preferred Embodiment

In the semiconductor integrated circuit according to the present invention, it is not always necessary to divide the first and the second semiconductor regions 3 and 4 in correspondence with the slice cells. If the slice cells, e.g., MOS transistors, which use the same power source potential are grouped in a certain area, the first and the second semiconductor regions 3 and 4 are divided to correspond to such areas each containing a group.

Figure 6:
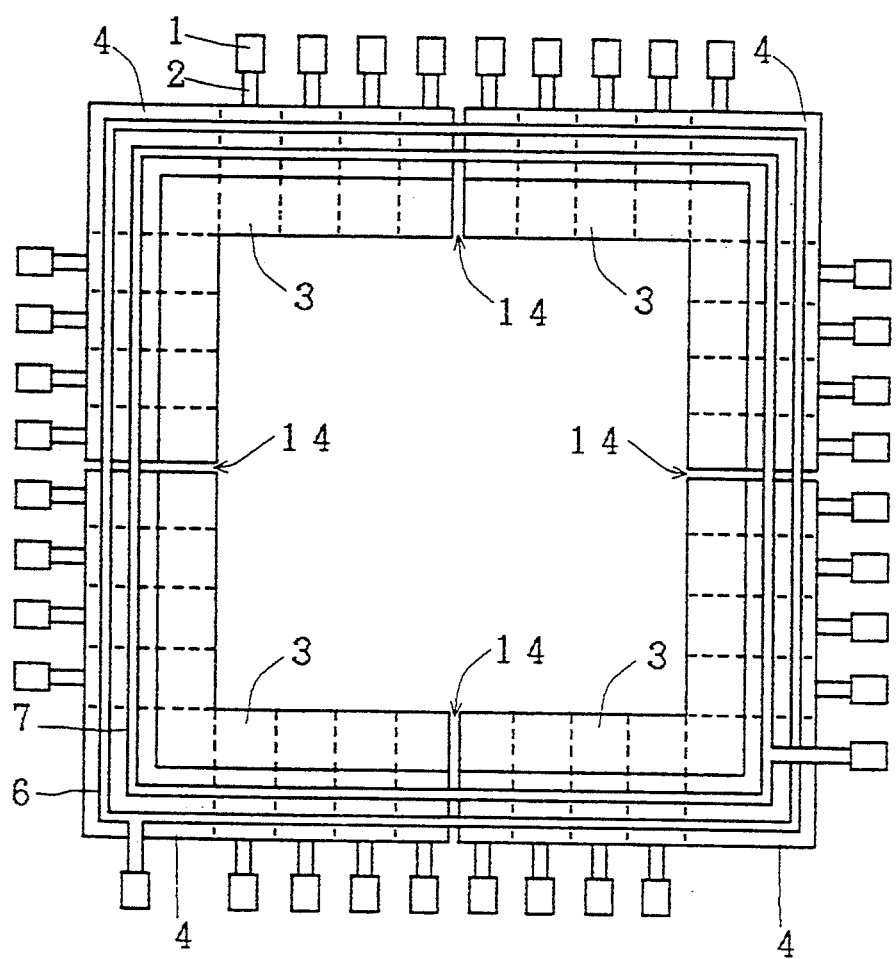
FIG. 6 is a plan view showing a third preferred embodiment.
Figure 7:
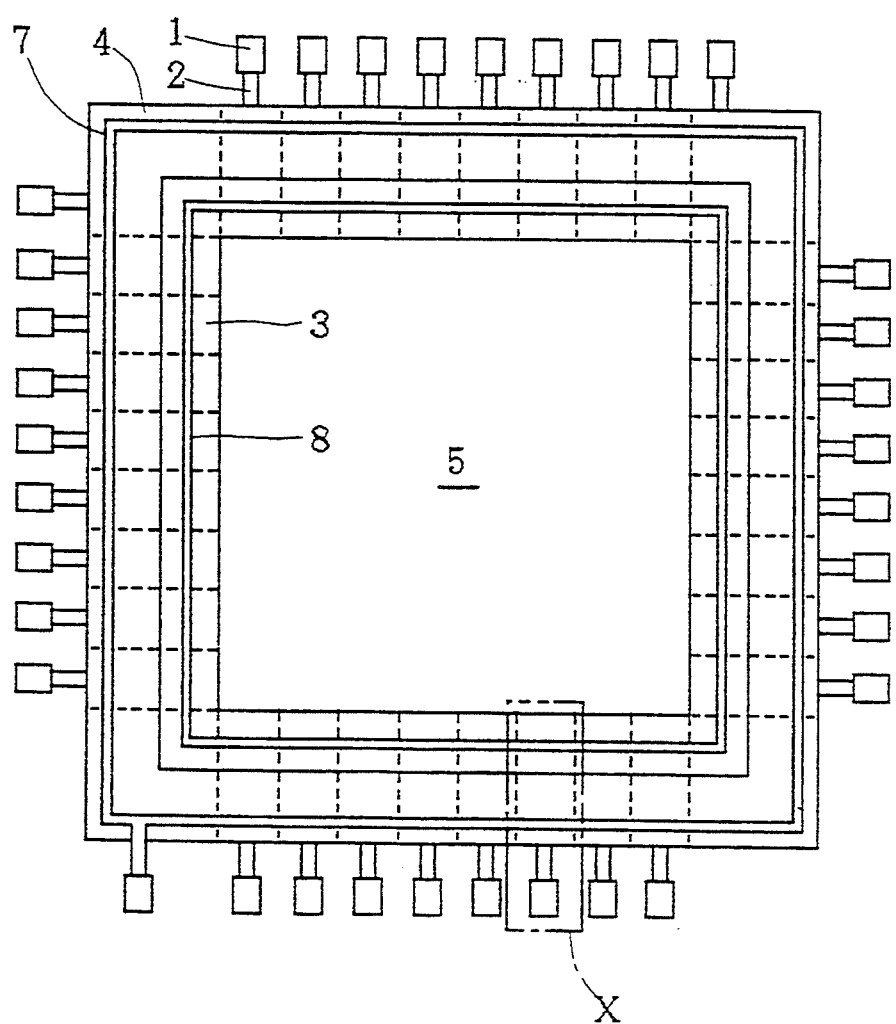
FIG. 7 and 8 are plan views showing a conventional technique.
Figure 8:
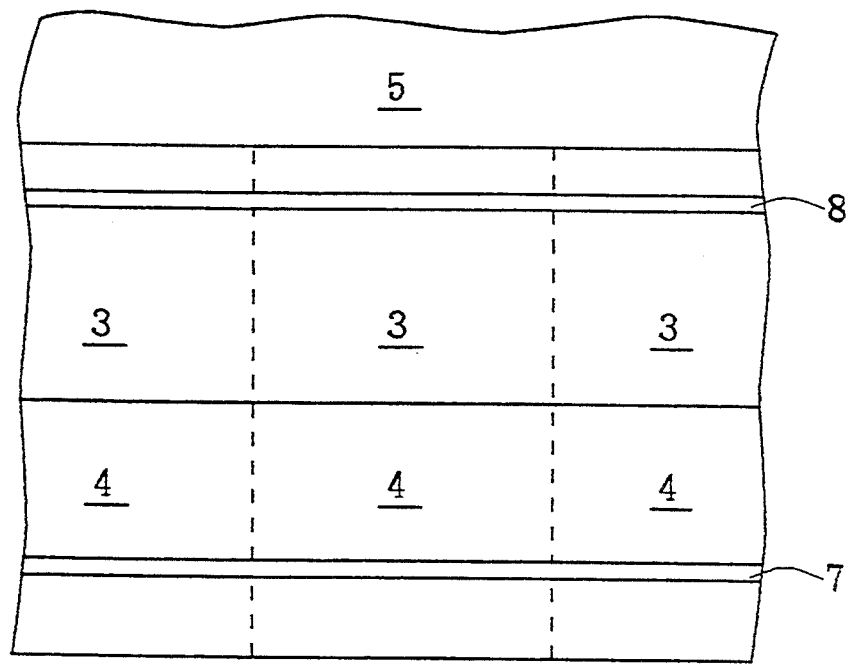
Figure 8:
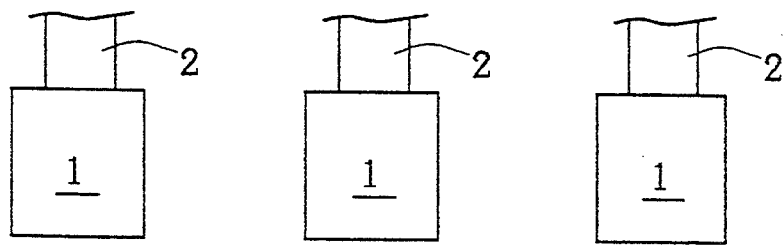
Figure 9:
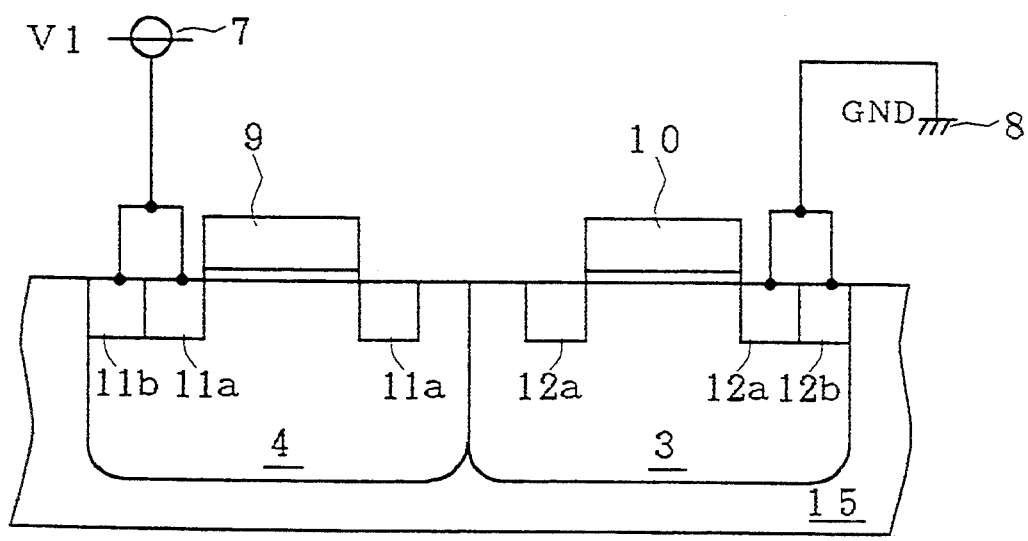
FIG. 9 is a cross sectional view showing the conventional technique.
Figure 10:
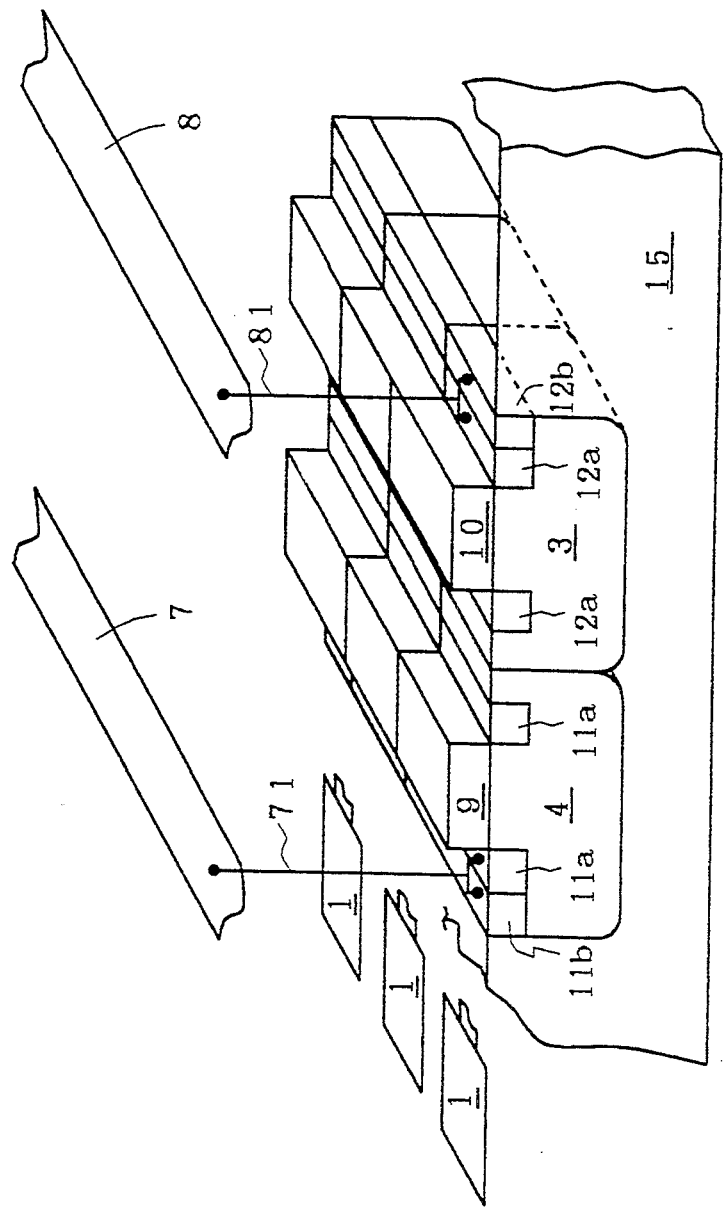
FIG. 10 is a perspective cross sectional view showing the conventional technique.

FIG. 6 is a plan view of a semiconductor integrated circuit according to a third preferred embodiment of the present invention. For simplicity of illustration, FIG. 6 omits connection made to the power source wire 8, which is connected to the first semiconductor region 3, and the metal wires 2. As shown in FIG. 6, the first and the second semiconductor regions 3 and 4 may be divided into areas each comprising the slice cells in the illustrative manner. In the example of FIG. 6, the first and the second semiconductor regions 3 and 4 are divided into four areas.

While the invention has been described in detail, the foregoing description is in all aspects illustrative and not restrictive. It is understood that numerous other modifications and variations can be devised without departing from the scope of the invention.

We claim:

1. A semiconductor integrated circuit comprising:
   a plurality of first semiconductor segments of a first conductivity type which are insulated from one another and arranged in a first lateral direction in a ring-like configuration;
   a plurality of second semiconductor segments of a second conductivity type which are arranged in said first lateral direction, each of said plurality of second semiconductor segments being disposed adjacent to each one of said first semiconductor segments in a second lateral direction which is perpendicular to said first lateral direction;
   a plurality of first power source wires which are disposed parallel to one another above all of said plurality of first semiconductor segments in said first and second lateral directions, said first power source wires being supplied with a plurality of different potentials, wherein one of said plurality of first power source wires is selectively connected to each one of said plurality of first semiconductor segments;
   a second power source wire which is disposed above and connected to each one of said plurality of second semiconductor segments;
   an inner circuit surrounded by said plurality of first semiconductor segments;
   at least one MOS transistor formed in said plurality of first semiconductor segments, said at least one MOS transistor comprising a first current electrode, a control electrode, and a second current electrode, said first current electrode being formed of said second semiconductor segments to which said first source wires are connected and being wider than said second current electrode.

2. A semiconductor integrated circuit comprising:
   a plurality of first semiconductor segments of a first conductivity type which are insulated from one another and arranged in a first lateral direction in a ring-like configuration;

a plurality of second semiconductor segments of a second conductivity type which are arranged in said first lateral direction, each of said plurality of second semiconductor segments being disposed adjacent to each one of said first semiconductor segments in a second lateral direction which is perpendicular to said first lateral direction;

a plurality of first power source wires which are disposed one on top of another above all of said plurality of first semiconductor segments in said first lateral direction, said first power source wires being supplied with a plurality of different potentials, wherein one of said plurality of first power source wires is selectively connected to each one of said plurality of first semiconductor segments;

a second power source wire which is disposed above and connected to each one of said plurality of second semiconductor segments;

an inner circuit surrounded by said plurality of first semiconductor segments;

at least one MOS transistor formed in said plurality of first semiconductor segments, said at least one MOS transistor comprising a first current electrode, a control electrode, and a second current electrode, said first current electrode being formed of said second semiconductor segments to which said first power source wires are connected.

3. A semiconductor integrated circuit according to claim 2, wherein each one of said first power source wires comprises notches, when viewed from above, said notches of one of said first power source wires not overlapping said notches of another one of said first power source wires.

* * * * *